(12) United States Patent
Hu et al.

(10) Patent No.: US 10,547,719 B2
(45) Date of Patent: Jan. 28, 2020

(54) ULTRATHIN ELECTRONIC DEVICE

(71) Applicant: JRD Communication (Shenzhen) LTD., Shenzhen (CN)

(72) Inventors: Zhiguo Hu, Shenzhen (CN); Dongshui Su, Shenzhen (CN); Feng Hu, Shenzhen (CN); Haibin Yu, Shenzhen (CN); Yunhui Peng, Shenzhen (CN)

(73) Assignee: JRD Communication (Shenzhen) LTD., Shenzhen (CN)

( * ) Notice: Subject to any disclaimer, the term of this patent is extended or adjusted under 35 U.S.C. 154(b) by 0 days.

(21) Appl. No.: 16/345,377

(22) PCT Filed: Oct. 9, 2017

(86) PCT No.: PCT/CN2017/105405
§ 371 (c)(1),
(2) Date: Apr. 26, 2019

(87) PCT Pub. No.: WO2018/082430
PCT Pub. Date: May 11, 2018

(65) Prior Publication Data
US 2019/0253544 A1 Aug. 15, 2019

(30) Foreign Application Priority Data
Nov. 1, 2016 (CN) .......................... 2016 1 0942233

(51) Int. Cl.
*H04B 1/38* (2015.01)
*H04M 1/02* (2006.01)
(Continued)

(52) U.S. Cl.
CPC ........ *H04M 1/0266* (2013.01); *G06F 1/1626* (2013.01); *G06F 1/1635* (2013.01);
(Continued)

(58) Field of Classification Search
CPC ............. H04M 1/0266; H04M 1/0262; H04M 1/72519; H04M 1/72522; G06F 1/1626;
(Continued)

(56) References Cited

U.S. PATENT DOCUMENTS 4,842,966 A * 6/1989 Omori ................. H01M 2/1044
307/150
2001/0017663 A1 * 8/2001 Yamaguchi ........ H04N 1/00249
348/373
(Continued)

FOREIGN PATENT DOCUMENTS

CN 101005288 A 7/2007
CN 204130604 U 1/2015
(Continued)

*Primary Examiner* — Danh C Le

(57) ABSTRACT

An ultrathin electronic device comprising a front housing, a display screen component, a frame-shaped rear housing, a battery and a battery cover is described. The front housing includes a side frame disposed around a periphery thereof, a lower bearing part, and a through-hole formed in a middle part of the bearing part; the display screen component is disposed in the front housing, a head part of the battery is inserted in the through-hole, and a space enclosed by the rear housing and the battery cover accommodates a tail part of the battery therein. In addition, a positioning lip on an outer wall of the battery is provided to further simplify the structure of a battery cover and front housing, and to reduce overall thickness of a battery cover and rear housing.

18 Claims, 2 Drawing Sheets

(51) Int. Cl.
*G06F 1/16* (2006.01)
*H05K 5/00* (2006.01)

(52) U.S. Cl.
CPC ......... *H04M 1/026* (2013.01); *H04M 1/0262* (2013.01); *H04M 1/0279* (2013.01); *H05K 5/0017* (2013.01); *H05K 5/0086* (2013.01)

(58) Field of Classification Search
CPC ... G04F 1/1635; H05K 5/0017; H05K 5/0086
USPC .................... 455/566, 556.1, 575.1; 307/150
See application file for complete search history.

(56) References Cited

U.S. PATENT DOCUMENTS

| | | | |
|---|---|---|---|
| 2006/0115723 A1* | 6/2006 | Ando ...................... | H01M 2/06 429/162 |
| 2014/0140032 A1* | 5/2014 | Kumazaki ............ | H05K 5/0217 361/809 |
| 2015/0155902 A1* | 6/2015 | Lin ...................... | H04B 1/3888 455/575.8 |
| 2015/0207906 A1* | 7/2015 | Ogatsu .............. | B29C 45/14336 455/575.8 |
| 2015/0304569 A1* | 10/2015 | Choi .................... | H04N 5/2256 359/696 |
| 2016/0173673 A1* | 6/2016 | Hyun .................... | H04M 1/236 455/566 |
| 2018/0047951 A1* | 2/2018 | Lee ........................ | H01M 2/10 |
| 2018/0122601 A1* | 5/2018 | Wisniewski ......... | H01H 23/145 |

FOREIGN PATENT DOCUMENTS

| | | |
|---|---|---|
| CN | 104853011 A | 8/2015 |
| CN | 205545429 U | 8/2016 |
| CN | 106453707 A | 2/2017 |

* cited by examiner

ULTRATHIN ELECTRONIC DEVICE

TECHNICAL FIELD

The present disclosure relates to the technical field of electronic devices, and particularly to an ultrathin electronic device.

BACKGROUND

With the continuous development of the smartphone industry, the market competition of mobile phones becomes increasingly fierce. The thickness of mobile phones has gradually become an important selling point for many major manufacturers. The emergence of ultrathin mobile phones plays an important role in improving the market competitiveness of mobile phones of a manufacturer.

As shown in FIG. 1, current mainstream smartphones mainly include a front housing 1, a touchscreen and display screen 2, a rear housing 3, a battery 4, and a battery cover 5. The touchscreen and display screen 2 is mounted on an upper surface of the front housing 1, the rear housing 3 is mounted on a lower surface of the front housing 1, the battery cover 5 is covered on a lower surface of the rear housing 3; in addition, the front housing 1, the rear housing 3 and the battery cover 5 together form a battery chamber in which the battery 4 is housed. As a result, the overall thickness of a smartphone includes at least a sum of the thickness of the front housing 1, the thickness of the rear housing 3 and the thickness of the battery cover 5. In such a design, the touchscreen and display screen 2 and the battery 4 each have a fixed thickness. In this regard, the ultimate thickness of the smartphone at least includes a sum of the thickness of the touchscreen and display screen 2, the space between the touchscreen and display screen 2 and a bottom plate of the front housing 1, the thickness of the bottom plate of the front housing 1, the thickness of the front housing 1, the thickness of the battery 4 and the thickness of the battery cover 5. Moreover, the thickness of the bottom plate is typically not less than 0.55 mm, accordingly there is no room to further reduce the overall thickness of a mobile phone.

SUMMARY

In view of the deficiencies in the existing technology, the present disclosure may provide an ultrathin electronic device which allows an electronic device with a battery to have an extremely thin thickness, thereby improving the market competitiveness of the product.

In one aspect of the present disclosure, an ultrathin electronic device includes a front housing, a display assembly, a frame-shaped rear housing, a battery and a battery cover, the front housing comprises a side frame disposed around a periphery thereof and a lower bearing part, a middle portion of the bearing part is provided with a through hole; the display screen assembly can be disposed in the front housing, a head portion of the battery can be inserted in the through hole, a space enclosed by the rear housing and the battery cover may accommodates a tail portion of the battery.

In one of the embodiments, an end surface of the head portion of the battery can be flush with the bearing part of the front housing.

In one of the embodiments, the battery further comprises a limiting flange protruding from a sidewall thereof, and the limiting flange may abut against a surface facing the rear housing of the bearing part of the front housing.

In one of the embodiments, an end surface of the rear housing facing the front housing recesses to form a first step portion connecting an inner wall of the rear housing, and the limiting flange can be embedded in the first step portion.

In one of the embodiments, the limiting flange can be a ring-shaped annular structure formed around the sidewall of the battery.

Alternatively, the limiting flange can be a plurality of protrusions spaced apart around the sidewall of the battery.

In one of the embodiments, an end surface of the tail portion of the battery can be flush with the rear housing, and the battery cover can be-attached to the end surfaces of the battery and the rear housing.

In one of the embodiments, an end surface of the rear housing away from the front housing is further provided with a second step portion, and the battery cover can be embedded in the second step portion.

In one of the embodiments, the battery cover comprises a boss having a central protrusion and a peripheral edge, the peripheral edge can be embedded in the second step portion, and the boss may abut against the battery.

In one of the embodiments, a seal member is provided between the peripheral edge and the second step portion.

In the present invention, the bottom portion of the front housing is provided with a through hole for accommodating a part of the battery, so that the battery and the display screen assembly are oppositely arranged. Accordingly, the thickness of the bottom plate of the front housing can be ignored in the design, the thickness of the whole device can be greatly reduced. In addition, the battery is restrained by a limiting flange provided on an outer wall of the battery, such that the entire battery can be made into an integral unit. In this way, the structures of the battery cover and the front housing have been further simplified, so as to reduce the overall thickness of the battery cover and the rear housing.

DETAILED DESCRIPTION

The present invention will be further described in detail below with reference to the accompanying figures and exemplary embodiments. It is understood that the exemplary embodiments described herein are merely for the purpose of describing the present invention and are not intended to limit the scope of the present claimed invention in any way.

Example 1

The electronic device of the present invention has a battery, which may be a smart terminal such as a mobile phone or a tablet computer, or may be, for example, a learning machine, a portable display or the like.

Figure 1:
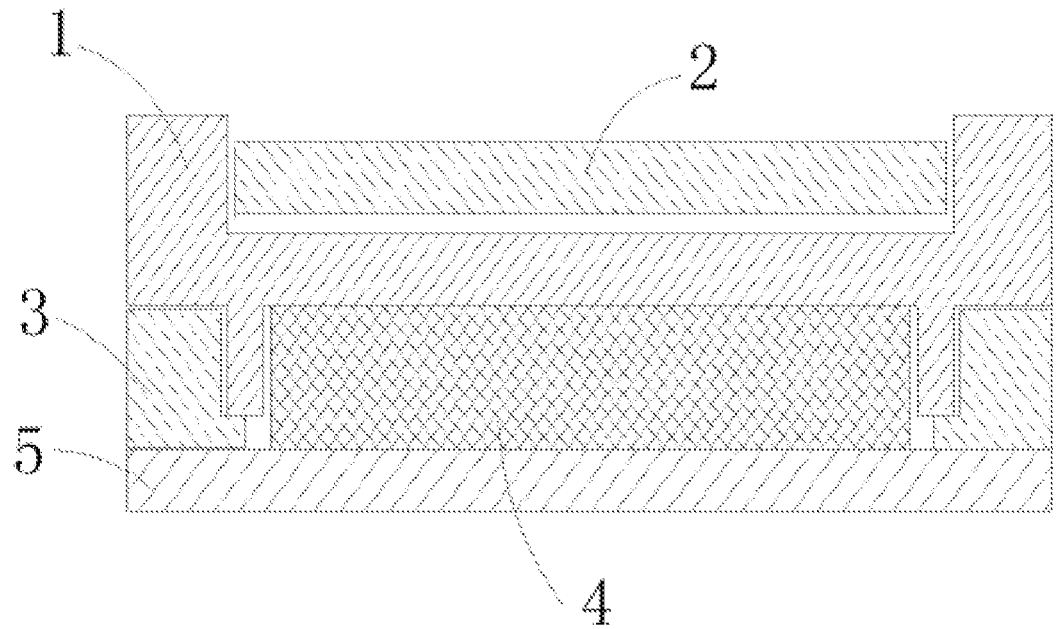
FIG. 1 illustrates a schematic view of an internal stack structure of an existing smartphone.
Figure 2:
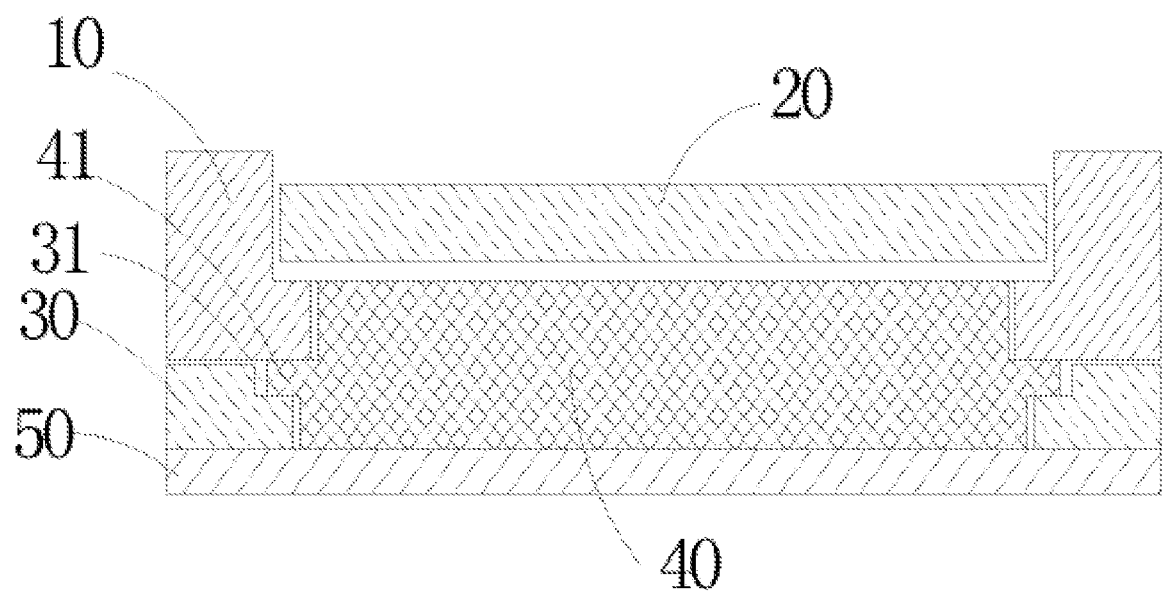
FIG. 2 illustrates a schematic view of an internal stack structure of an ultrathin electronic device according to an exemplary embodiment of the present invention.

In reference to FIG. 2, FIG. 2 illustrates a schematic view of an internal stack structure of an ultrathin electronic device according to an exemplary embodiment of the present invention. The ultrathin electronic device of this embodiment has a front housing 10, a display assembly 20, a frame-shaped rear housing 30, a battery 40 and a battery cover 50, the front housing 10 includes a side frame disposed around a periphery thereof and a lower bearing part, a middle portion of the bearing part is provided with a through hole; the display screen assembly 20 can be disposed in the front housing 10, a head portion of the battery 40 can be inserted in the through hole, a space enclosed by the rear housing 30 and the battery cover 50 can accommodate a tail portion of the battery 40. In one embodiment, the display assembly 20 may be a display screen and a touchscreen, or it may not include a touchscreen.

Since the bottom portion of the front housing 10 is provided with a through hole, a portion in the height direction of the battery 40 can be inserted into the through hole. As a result, the front housing 10 partially overlaps with the battery 40 in their thickness direction, which helps to reduce a sum of their thicknesses. In an embodiment, an end surface of the head portion of the battery 40 can be flush with the bearing part of the front housing 10. As a result, the thickness of the bearing part of the front housing 10 can be allowed to be thicker than that in the existing technology; in addition, it may also be designed to have other accommodating slots, holes and the like for accommodating other structural members, which further improves the overall structural compactness and stability of the ultrathin electronic device.

In one embodiment, the battery 40 can further comprise a limiting flange 41 protruding from a sidewall thereof, and the limiting flange 41 may abut against a surface facing the rear housing 30 of the bearing part of the front housing 10.

In another embodiment, an end surface of the rear housing 30 facing the front housing 10 may recess to form a first step portion 31 connecting an inner wall of the rear housing 30, such that the front housing 10 and the rear housing 30 can be attached and fixed to each other, and an end surface of the front housing 10 and the first step portion 31 can form a circle of annular groove, the limiting flange 41 can be embedded in the first step portion 31, and may abut against the first step portion 31 and the front housing 10 at the same time.

In yet another embodiment, the limiting flange 41 can be a ring-shaped annular structure formed around the sidewall of the battery 40. The first step portion 31 can be a recessive ring. In yet another embodiment, the limiting flange 41 may be a plurality of protrusions spaced apart around the sidewall of the battery 40. Accordingly, the first step portion 31 would be a plurality of recessive portions spaced apart in an annular arrangement. A plurality of protrusions of limiting flanges 41 would be respectively embedded in a plurality of recessive portions spaced apart.

In one embodiment, an end surface of the tail portion of the battery 40 can be flush with the rear housing 30. The battery cover 50 can be substantially in the form of a flat plate and can be attached to the end surfaces of the battery 40 and the rear housing 30, such that the rear housing 30 and the battery 40 can be both protected therein. Since the battery 40 is restrained by the limit flange 41, the battery cover 50 is not applied with a force, and thus can be made thinner.

In another aspect, in an assembling process, the display screen assembly 20 can be first affixed into the front housing 10 by optical glue or the like, to maintain a certain distance between the display screen assembly 20 and the bearing part, and then the head portion of the battery 40 can be loaded into the through hole of the bearing part, next the rear housing 30 and the front housing 10 can be assembled such that the limiting flange 41 of the battery 40 can be held by a first step portion 31 provided between the rear housing 30 and the front housing 10, at this time, the battery 40, the rear housing 30 and the front housing 10 can be assembled into one integral unit. Finally, the battery cover 50 can be placed on the outer surfaces of the rear housing 30 and the battery 40, and the assembly can be thus completed.

Example 2

Figure 3:
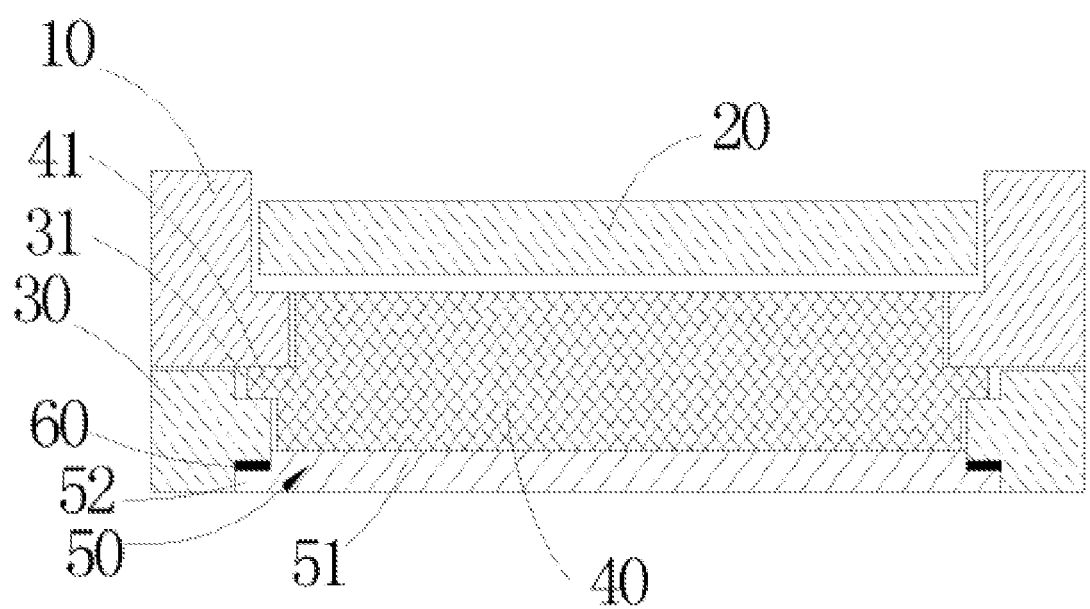
FIG. 3 illustrates a schematic view of an internal stack structure of an ultrathin electronic device according to an exemplary embodiment of the present invention.

FIG. 3 illustrates a schematic view of an internal stack structure of an ultrathin electronic device according to another exemplary embodiment of the present invention. As shown in FIG. 3, this example is a slight modification on the basis of Example 1. Specifically, an end surface of the rear housing 30 away from the front housing 10 can be further provided with a second step portion. Two end surfaces of the rear housing 30 are respectively provided with a first step portion 31 and a second step portion, and the inner wall of the rear housing 30 is connected with both the first step portion 31 and the second step portion. By way of making the battery cover 50 embedded in the second step portion, the overall compactness of the electronic device can be further improved. The battery 40 is restricted by the limiting flange 41. In addition, since the battery cover 50 is not applied with a force, it can be made thinner.

In an embodiment, the battery cover 50 can include a boss 51 having a central protrusion and a peripheral edge 52, the peripheral edge 52 can be embedded in the second step portion, and the boss 51 may abut against the battery 40. In addition, a seal member 60 can be provided between the peripheral edge 52 and the second step portion, which can prevent moisture, dust, etc. from entering the interior of the device.

In the present disclosure, the bottom portion of the front housing is provided with a through hole for accommodating a part of the battery, so that the battery and the display screen assembly can be oppositely arranged. Accordingly, the thickness of the bottom plate of the front housing can be ignored in the design, thus, the thickness of the whole device can be greatly reduced. In addition, the battery is restrained by a limiting flange provided on an outer wall of the battery, the entire battery can be made into an integral unit. In this way, the structures of the battery cover and the front housing have been further simplified, so as to reduce the overall thickness of the battery cover and the rear housing. The battery 40 is confined between the front housing and the rear housing via the limit flange. As a result, the battery cover is not applied with a force, it can be made thinner.

The above description is only a few exemplary embodiments of the present application, and it should be noted that a person of ordinary skill in the art can also make some improvements and modifications without departing from the principle of the present application. These improvements and modifications should be viewed to be within the scope of the present application.

The invention claimed is:

1. An ultrathin electronic device, comprising:
a front housing;
a display assembly;
a frame-shaped rear housing;
a battery; and
a battery cover,
wherein:
the front housing comprises a side frame disposed around a periphery thereof, a lower bearing part, and a through hole formed in a middle portion of the bearing part, the display screen assembly is disposed in the front housing, a head portion of the battery is inserted in the through hole, a space enclosed by the rear housing and the battery cover accommodates a tail portion of the battery, an end surface of the head portion of the battery is flush with the bearing part of the front housing, and the battery further comprises a limiting flange protruding from a sidewall thereof, and the limiting flange abuts against a surface facing the rear housing of the bearing part of the front housing.

2. The ultrathin electronic device according to claim 1, wherein an end surface of the rear housing facing the front housing recesses to form a first step portion connecting an inner wall of the rear housing, and the limiting flange is embedded in the first step portion.

3. The ultrathin electronic device according to claim 2, wherein the first step comprises a recessive ring.

4. The ultrathin electronic device according to claim 1, wherein the limiting flange comprises a ring-shaped annular structure formed around the sidewall of the battery.

5. The ultrathin electronic device according to claim 1, wherein the limiting flange comprises a plurality of protrusions spaced apart around the sidewall of the battery.

6. The ultrathin electronic device according to claim 1, wherein an end surface of the tail portion of the battery is flush with the rear housing, and the battery cover is attached to the end surfaces of the battery and the rear housing.

7. The ultrathin electronic device according to claim 1, wherein an end surface of the rear housing away from the front housing is further provided with a second step portion, and the battery cover is embedded in the second step portion.

8. The ultrathin electronic device according to claim 7, wherein the battery cover comprises a boss having a central protrusion and a peripheral edge, the peripheral edge is embedded in the second step portion, and the boss abuts against the battery.

9. The ultrathin electronic device according to claim 8, wherein a seal member is provided between the peripheral edge and the second step portion.

10. An ultrathin electronic device, comprising:
front housing;
a display assembly;
a frame-shaped rear housing;
a battery; and
a battery cover, wherein:
the front housing comprises a side frame disposed around a periphery thereof, a lower bearing part, and a through hole provided in a middle portion of the bearing part,
the display screen assembly is disposed in the front housing,
a head portion of the battery is inserted in the through hole, a space enclosed by the rear housing and the battery cover accommodates a tail portion of the battery,
an end surface of the head portion of the battery is flush with the bearing part of the front housing,
the battery further comprises a limiting flange protruding from a sidewall thereof, and
the limiting flange abuts against a surface facing the rear housing of the bearing part of the front housing, and
an end surface of the rear housing facing the front housing recesses to form a first step portion connecting an inner wall of the rear housing, and the limiting flange is embedded in the first step portion.

11. An ultrathin electronic device, comprising:
a front housing;
a display assembly;
a frame-shaped rear housing;
a battery; and
a battery cover,
wherein the front housing comprises a side frame disposed around a periphery thereof,
a lower bearing part, and a through hole formed in a middle portion of the bearing part,
the display screen assembly is disposed in the front housing, and
a head portion of the battery is inserted in the through hole, a space enclosed by the rear housing and the battery cover accommodates a tail portion of the battery wherein an end surface of the rear housing away from the front housing is further provided with a second step portion, and the battery cover is embedded in the second step portion,
wherein the battery cover comprises a boss having a central protrusion and a peripheral edge, the peripheral edge is embedded in the second step portion, and the boss abuts against the battery.

12. The ultrathin electronic device according to claim 11, wherein an end surface of the head portion of the battery is flush with the bearing part of the front housing.

13. The ultrathin electronic device according to claim 11, wherein the battery further comprises a limiting flange protruding from a sidewall thereof, and the limiting flange abuts against a surface facing the rear housing of the bearing part of the front housing.

14. The ultrathin electronic device according to claim 13, wherein an end surface of the rear housing facing the front housing recesses to form a first step portion connecting an inner wall of the rear housing, and the limiting flange is embedded in the first step portion.

15. The ultrathin electronic device according to claim 13, wherein the limiting flange is a ring-shaped annular structure formed around the sidewall of the battery.

16. The ultrathin electronic device according to claim 13, wherein the limiting flange comprises a plurality of protrusions spaced apart around the sidewall of the battery.

17. The ultrathin electronic device according to claim 11, wherein an end surface of the tail portion of the battery is flush with the rear housing, and the battery cover is attached to the end surfaces of the battery and the rear housing.

18. The ultrathin electronic device according to claim 11, wherein a seal member is provided between the peripheral edge and the second step portion.

\* \* \* \* \*